United States Patent

Hsu

[11] Patent Number: 5,777,486
[45] Date of Patent: Jul. 7, 1998

[54] ELECTROMIGRATION TEST PATTERN SIMULATING SEMICONDUCTOR COMPONENTS

[75] Inventor: Chen-Chung Hsu, Taichung, Taiwan

[73] Assignee: United Microelectronics Corporation, Taiwan

[21] Appl. No.: 777,119

[22] Filed: Dec. 30, 1996

Related U.S. Application Data

[62] Division of Ser. No. 317,017, Oct. 3, 1994, abandoned.

[51] Int. Cl.$^6$ .................................................. G01R 1/04
[52] U.S. Cl. ........................... 324/763; 324/765; 324/719
[58] Field of Search ........................ 324/73.1, 158.1, 324/500, 537, 719, 612–613, 763–765, 716; 437/8; 257/40, 778, 48, 758, 754, 765; 438/18, 17

[56] References Cited

U.S. PATENT DOCUMENTS

| | | | |
|---|---|---|---|
| 3,851,245 | 11/1974 | Baker et al. | 324/537 |
| 3,974,443 | 8/1976 | Thomas . | |
| 4,144,493 | 3/1979 | Lee et al. | 29/574 |
| 4,652,812 | 3/1987 | Gimpelson et al. | 324/158.1 |
| 4,778,771 | 10/1988 | Hiki | 437/8 |
| 4,942,357 | 7/1990 | Chang | 324/65 |
| 4,954,480 | 9/1990 | Imanaka et al. | 257/758 |
| 5,049,811 | 9/1991 | Dreyer et al. | 324/73.1 |
| 5,051,812 | 9/1991 | Onaki et al. | 257/758 |
| 5,091,768 | 2/1992 | Yamazaki | 257/758 |
| 5,138,427 | 8/1992 | Furuyama | 357/68 |
| 5,239,270 | 8/1993 | Desbiens | 324/767 |
| 5,264,377 | 11/1993 | Chesire et al. | 437/8 |
| 5,286,676 | 2/1994 | Kruger et al. | 437/190 |
| 5,291,142 | 3/1994 | Ohmi | 324/158.1 |
| 5,355,020 | 10/1994 | Lee et al. | 257/765 |
| 5,448,179 | 9/1995 | Burns . | |
| 5,475,236 | 12/1995 | Yoshizaki | 257/48 |

*Primary Examiner*—Vinh P. Nguyen
*Attorney, Agent, or Firm*—Rabin, Champagne, & Lynt, P.C.

[57] ABSTRACT

A test pattern simulates conductors and interconnections of conductors of a multi-layer semiconductor device that may be subject to damage from electromigration. Test pattern elements are connected in a series circuit with two connection points for applying a test current to the elements. A break in this circuit or an increase in resistance during the test signifies that electromigration has damaged the test pattern and that the operating components of the device may have manufacturing defects that make them susceptible to electromigration. Probe points can be provided for testing particular parts of the series circuit. The pattern has at least one conductive stripe or other element in each layer of the device and it has interconnecting vias between these elements through one or more intervening layers of insulation where corresponding layer-to-layer interconnections are made in the operating components of the device. On the surface of the device, diffusions form part of the circuit path. The diffusions can be connected as a buried contact if the device uses this structure.

9 Claims, 1 Drawing Sheet

ELECTROMIGRATION TEST PATTERN SIMULATING SEMICONDUCTOR COMPONENTS

This is a divisional of application Ser. No. 08/317,017 filed on Oct. 3, 1994, now abandoned.

FIELD OF THE INVENTION

This invention relates to the manufacture and testing of semiconductor devices and more specifically to a pattern of test elements that simulate components of a semiconductor device during a test for electromigration.

INTRODUCTION

Electromigration is a process affecting reliability in which metal ions of a conductor are physically carried along in the direction of electron flow. The electron flow causes a hillock to form on the positive side of a developing fault and a void to form on the negative side.

Electromigration is particularly likely to occur at high current density and high temperature. These conditions often occur together at poor interconnections where the cross sectional area of the interconnection may be less than the area of the conductor outside the interconnection and where the resistance of the poor interconnection creates heating. Electromigration is similarly likely to occur in a conductive metal stripe that has defects where the cross sectional area is less than the intended area.

Electromigration has been a problem in semiconductor devices because their conductors have small cross sectional dimensions that give them high current densities and allow small variations in manufacturing to have a large effect on this area. In a semiconductor device, the conditions for electromigration can occur in a metal conductive stripe, and it is particularly likely to occur at interconnections between metal stripes, between a metal stripe and a metal via that interconnects stripes at different levels, at connections between vias or stripes and silicon, at the interface of a polycrystalline silicon conductor a metal stripe or via, and at an interconnection point between two polycrystaline conductors.

It is desirable to test semiconductor devices for their susceptability to electromigration. The prior art has suggested producing models of conductive stripes and the components that make interconnections. These models are called test patterns, and they are tested at various stages of the manufacturing process. Electromigration is ordinarily a slow process, and the tests are made under conditions of higher than normal current and temperature that provide the same stress as normal operation for a much longer time. Tests in the prior art typically are run for about one thousand hours at a temperature in the range of 190° C. to 250° C. and a current density of 1 to 2.5 micro-amperes per square centimeter.

SUMMARY OF THE INVENTION

This invention provides a new test pattern that permits a single test to detect several different failures. In the new test pattern, several structures that are susceptible to electromigration are connected in a series circuit between two test points. A suitable test current is applied to the test points and the current is monitored to detect a break in the circuit or a significantly increased circuit resistance, conditions which signify probable damage by electromigration.

Semiconductor devices commonly have a silicon substrate and several layers of polycrystalline or metal conductive stripes and intervening layers of insulation. Conductive vias interconnect stripes that are separated by one or several insulation layers. These alternating layers of insulation and conductors are formed one after the other in a sequence of process steps.

It is possible for some of the layers of an otherwise good semiconductor device to have manufacturing defects that make the conductors and interconnections in these layers more likely to be damaged by electromigration, and the test pattern of this invention is adapted to test all layers of a device.

The test pattern of this invention has metal stripe elements and polysilicon stripe elements in the conductive layers and conductive vias through the intervening insulation. These pattern elements are formed at the same time as the corresponding elements of the logic and storage devices of the chip, and they are likely to have any defects that occur in these other circuit elements. In a multi-layer device, pattern elements are preferably formed in each layer since electromigration is particularly liable to occur when layers separate. The circuit path can be folded to provide several test elements on each layer within a small area.

It is an advantage of this invention that the test can be run with the parameters of time, current and temperature that are usual for these tests.

In one embodiment of the invention, additional test points are connected to the test elements of the series circuit. When a general failure has been detected in the series of elements (an open circuit or an increase in resistance during the test), the additional test points can be probed to detect the point where the circuit is broken and to thereby identify the failure. This additional information will be useful in correcting a problem with the manufacturing process.

THE DRAWING

THE PREFERRED EMBODIMENT—FIG. 1

Figure 1:
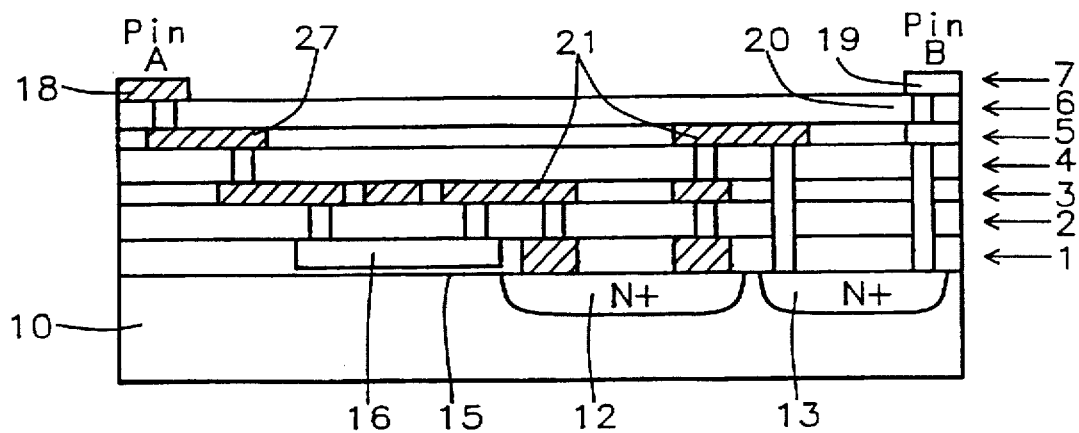
FIG. 1 is an edge view of a semiconductor structure showing the preferred electromigration test pattern of this invention.

FIG. 1 shows the part of a semiconductor device that forms the test pattern of this invention. Commonly, test patterns are located along lines where a wafer will be cut into individual chips after the tests have been made. As one alternative, one or more special chips can be made as part of a wafer and tested after the wafer has been cut into chips.

The semiconductor device has a substrate 10 which is arbitrarily P type. During manufacture, diffusions for components such as transistors are formed in the substrate and conductors and insulators are formed in layers on the substrate to interconnect these components. The seven layers in FIG. 1, 1 to 7, are representative of devices having any selected number of layers. The test pattern elements shown in FIG. 1 are formed layer by layer as the other components of the chip are formed, and these elements resemble the other components in their general structure and in their susceptability to damage from electromigration that may be attributable to peculiarities of the manufacturing process for a particular wafer.

The arrangement of the test pattern elements in FIG. 1 illustrates several features of this invention that can be implemented in various ways for a particular application. Two N⁺ diffusions 12, 13 are formed in the substrate in the process of forming similar diffusions in operating devices of the wafer. A layer of field insulation 15 is formed during the corresponding step for the other components, and a simulated gate electrode 16 is formed in the same process step that forms the gate electrodes FETs of the device. The gate electrode 16 can be metal or polycrystalline silicon. This structure can form a buried contact, a connection between a polycrystaline conductor forming the gate electrode and an N⁺ diffusion through the intervening gate insulation. A known SRAM process (static semiconductor memory) includes a buried contact with polysylicon directly in contact contact with an N⁺ diffusion. The poly to N⁺ interconnection in the device of FIG. 1 is used to stress the buried contact resistance change.

A system of conductors is formed on the substrate in layers 1–7 as corresponding layers are formed over the active device area. Conductive patterns 18 and 19 on the uppermost layer 7 form test pin A and test pin B respectively and are connected in a series circuit with the other elements as will be explained.

A circuit path can be traced between test pin A and test pin B. This path includes the gate electrode 16, the two diffusions 12 and 13, and a sequence of metal vias 20 and conductive stripes 21 that will be described later. Notice that the circuit path is folded to provide several stripes or several vias in each layer. From test pin A the path goes sequentially from layer 7 to layer 1 through an alternating sequence of stripes and vias. The path then rises to layer 6 and then returns to layer 1 for contact with the N⁺ diffusion 12. From a second contact with diffusion 12, the path rises to layer 5 and then returns to layer 1 for contact with the N⁺ diffusion 13. The other contact with diffusion 13 is a via through layers 1–4 to a via at level 5 and a via to Pin B at level 7. Note for example, there are three stripes in each conductor layer, 1, 3 and 5.

The two diffusions 12 and 13 provide two complementary tests. The two contacts with diffusion 12 are made by conductive stripes and the two contacts with diffusion 13 are made by vias. The preferred test pattern has a separate diffusion for each of the two types of metal-to-silicon interconnection because electromigration occurs only at the interface where electrons flow from the silicon to the metal.

The path from pin A to pin B constitutes a single test module. If we want to reduce the power supply level to get the same current density or to improve the sensitivity, we can parallel several of these single test modules and stress them all at the same time. The current polarity also can be changed to find the critical layer in this test module.

The conductive stripes are commonly made of metal or of highly doped polycrystalline silicon; the active devices of a chip may have a mixture of these materials and the structure of FIG. 1 is constructed to have a corresponding mixture to represent the active device.

Making the Test

At an appropriate point in the manufacturing process, a predetermined voltage is applied across pin A and pin B. Appropriate testers are well known. The voltage and duration and other environmental conditions of the test are conventional, as already explained.

If a component fails, the circuit is broken and the interruption of the test current signals the failure. The cause of the failure can be assumed to be electromigration, or the chip can be disassembled by known techniques to study the failure.

A TEST PATTERN WITH PROBE POINTS—FIG. 2

Figure 2:
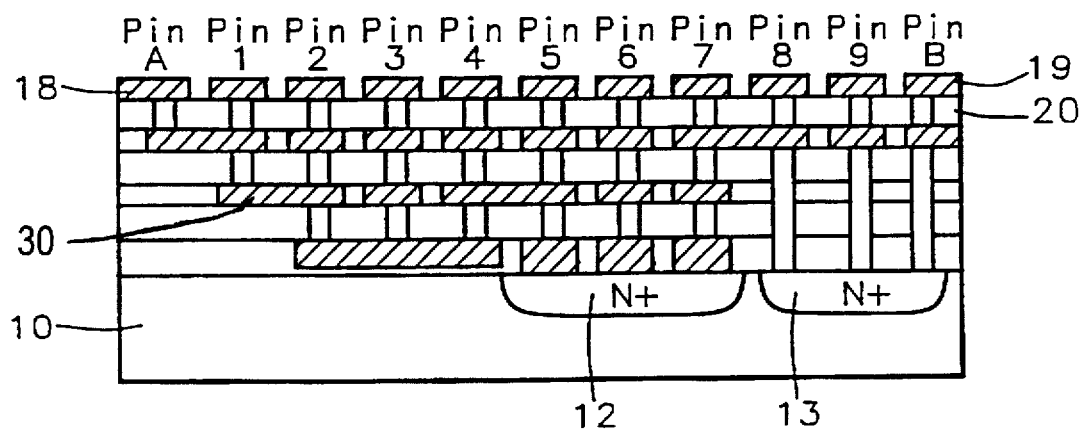
FIG. 2 is an edge view of a semiconductor structure showing the electromigration test pattern of this invention with additional probe points for identifying the specific point of a failure.

The test pattern of FIG. 2 provides additional test points, pin1 through pin9, for identifying the failed element by an extension of the test that has been described for FIG. 1.

For example, if electromigration damage occurs in stripe 30 in layer 3, the circuit between pin A and pin B becomes opened or has an increase in resistance which signifies that the damage has occurred somewhere in the test circuit path. A further test would show that the test element circuit is still continuous between Pin A and pint and between pin2 and Pin B but that it has been opened or has acquired an increased resistance between pin1 and pin2. The test pattern elements and the additional test points are arranged so that only a particular type of electromigration can have occurred between two adjacent test points.

Note that an additional connection is made at the midpoint of the gate electrode 16. If a failure occurs at one of the connections to the gate, the failing connection can be identified.

An additional connection is also made at the midpoint of each of the two diffusions 12 and 13.

Other Embodiments

Those skilled in the art will recognize many applications for this electromigration test pattern and appropriate modifications of the preferred test pattern within the skill of the art and the intended scope of the claims.

I claim:

1. A method of predicting electromigration failures in a multilayer semiconductor device, the method comprising:

providing a substrate;

providing on the substrate a test pattern, the test pattern comprising first, second and third test pattern elements connected in series between a first test pin and a second test pin, the first test pin connected to a first contact of the first test pattern element, a second contact of the first test pattern element connected to a first contact of the second test pattern element, a second contact of the second test pattern element connected to a first contact of the third test pattern element, a second contact of the third test pattern element connected to the second test pin, the test pattern also including at least one intermediate test pin coupled to the test pattern between the first and second test pins;

applying a test current to the test pattern by applying a test voltage between the first and second test pins until the test pattern fails; and probing the test pattern to identify which of the first, second and third test pattern elements failed under the test voltage.

2. The method of claim 1, wherein the step of probing identifies the type of element where an open circuit occurs.

3. The method of claim 1, wherein the test pattern includes a first intermediate test pin coupled to the first test pattern element, a second intermediate test pin coupled to the second test pattern element, and a third intermediate test pin coupled to the third test pattern element.

4. The method of claim 3, wherein the step of probing includes testing an electrical characteristic between two adjacent test pins.

5. The method of claim 1, wherein the test pattern includes a first intermediate test pin coupled to the first test pattern element, a second intermediate test pin coupled to the second test pattern element, a third intermediate test pin coupled to the second test pattern element, and a fourth intermediate test pin coupled to the third test pattern element.

6. The method of claim 5, wherein the step of probing includes measuring resistance between at least one adjacent pair of the first test pin and the intermediate test pins.

7. The method of claim 6, wherein the third test pattern element comprises:

first and second diffusion regions formed in the substrate, the first and second diffusion regions separated in the substrate; and a first conductive stripe extending between the first and second diffusion regions and electrically coupling the first diffusion region to the second diffusion region.

8. The method of claim 7, wherein the first test pattern element includes a first metal via, a metal conductive stripe, and a second metal via.

9. The method of claim 5, wherein the second test pattern element includes a layer of polysilicon formed over a layer of gate oxide on the substrate.

\* \* \* \* \*